(12) United States Patent
Jee et al.

(10) Patent No.: US 11,955,828 B2
(45) Date of Patent: Apr. 9, 2024

(54) BATTERY MANAGEMENT APPARATUS AND METHOD USING NON-DESTRUCTIVE RESISTANCE ANALYSIS

(71) Applicant: LG CHEM, LTD., Seoul (KR)

(72) Inventors: Su-Won Jee, Daejeon (KR); Young-Deok Kim, Daejeon (KR); Dae-Soo Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 531 days.

(21) Appl. No.: 17/270,684

(22) PCT Filed: Apr. 17, 2020

(86) PCT No.: PCT/KR2020/005188
§ 371 (c)(1),
(2) Date: Feb. 23, 2021

(87) PCT Pub. No.: WO2020/214000
PCT Pub. Date: Oct. 22, 2020

(65) Prior Publication Data
US 2021/0344212 A1 Nov. 4, 2021

(30) Foreign Application Priority Data

Apr. 19, 2019 (KR) .................. 10-2019-0046308

(51) Int. Cl.
*H02J 7/00* (2006.01)
*G01R 31/367* (2019.01)
(Continued)

(52) U.S. Cl.
CPC ........ *H02J 7/00712* (2020.01); *G01R 31/367* (2019.01); *G01R 31/3842* (2019.01);
(Continued)

(58) Field of Classification Search
CPC .... H02J 7/00712; H02J 7/0013; H02J 7/0047; G01R 31/367; G01R 31/3842;
(Continued)

(56) References Cited

U.S. PATENT DOCUMENTS

| 6,377,030 B1 | 4/2002 | Asao et al. |
| 8,447,544 B2 * | 5/2013 | Hsu .................. G01R 31/367 |
| | | 702/66 |

(Continued)

FOREIGN PATENT DOCUMENTS

| CA | 2795519 A1 * | 6/2012 | ............ H04W 4/023 |
| CN | 102445663 A | 5/2012 | |

(Continued)

OTHER PUBLICATIONS

Extended European Search Report dated Jan. 14, 2022, issued by the European Patent Office in corresponding European Patent Application No. 20791386.4.

(Continued)

*Primary Examiner* — M Baye Diao
(74) *Attorney, Agent, or Firm* — Morgan, Lewis & Bockius LLP (57) ABSTRACT

The present disclosure relates to a battery management apparatus and method, and more particularly, to a battery management apparatus and method using non-destructive resistance analysis for analyzing the change of resistance of a battery cell. According to an embodiment of the present disclosure, even if the EIS (Electrochemical Impedance Spectroscopy) analysis is not used, the resistance change rate of the battery cell may be calculated non-destructively using the QV curve and the Q-dV/dQ curve of the battery cell.

16 Claims, 4 Drawing Sheets

(51) Int. Cl.
   *G01R 31/3842* (2019.01)
   *G01R 31/389* (2019.01)
   *G01R 31/396* (2019.01)
   *H01M 10/48* (2006.01)

(52) U.S. Cl.
   CPC ......... *G01R 31/389* (2019.01); *G01R 31/396* (2019.01); *H01M 10/48* (2013.01); *H02J 7/0013* (2013.01); *H02J 7/0047* (2013.01)

(58) Field of Classification Search
   CPC .. G01R 31/389; G01R 31/396; G01R 31/392; G01R 31/3648; H01M 10/48; H01M 4/386; H01M 2010/4271; H01M 10/0525; H01M 2004/027; H01M 2220/20; H01M 4/587; H01M 10/425; H01M 10/44; H01M 10/052; Y02E 60/10
   USPC ......................................... 320/134
   See application file for complete search history.

(56) References Cited

U.S. PATENT DOCUMENTS

| | | | |
|---|---|---|---|
| 10,101,399 B2 * | 10/2018 | Tamegai | G01R 31/3842 |
| 10,393,813 B2 * | 8/2019 | Sun | H02J 7/005 |
| 10,775,444 B2 * | 9/2020 | Tashiro | G01R 31/3842 |
| 11,264,599 B2 * | 3/2022 | Kim | G01N 27/12 |
| 11,448,708 B2 * | 9/2022 | Wuebbeler | G01R 31/382 |
| 2010/0247988 A1 | 9/2010 | Okumura et al. | |
| 2011/0012604 A1 | 1/2011 | Tsujiko et al. | |
| 2012/0169288 A1 | 7/2012 | Ueki et al. | |
| 2012/0226455 A1 | 9/2012 | Kumashiro et al. | |
| 2013/0314050 A1 * | 11/2013 | Matsubara | H02J 7/00 320/134 |
| 2013/0335009 A1 | 12/2013 | Katsumata et al. | |
| 2014/0139189 A1 * | 5/2014 | Izumi | H02J 7/0048 320/134 |
| 2016/0025814 A1 * | 1/2016 | Ide | G01R 31/388 324/432 |
| 2016/0190658 A1 | 6/2016 | Ishibashi et al. | |
| 2016/0252585 A1 * | 9/2016 | Baba | H02J 7/005 702/63 |
| 2016/0254687 A1 * | 9/2016 | Tanaka | H01M 10/425 320/112 |
| 2016/0259011 A1 | 9/2016 | Joe | |
| 2016/0356855 A1 | 12/2016 | Tamegai | |
| 2019/0081369 A1 * | 3/2019 | Monden | H02J 7/00 |
| 2019/0170831 A1 * | 6/2019 | Sada | G01R 31/389 |

FOREIGN PATENT DOCUMENTS

| | | | | |
|---|---|---|---|---|
| CN | 102655245 A | | 9/2012 | |
| CN | 103698714 A | | 4/2014 | |
| CN | 105637379 A | | 6/2016 | |
| CN | 104145398 B | * | 4/2017 | ............. B60L 58/21 |
| EP | 0 981 194 A2 | | 2/2000 | |
| EP | 3828568 A1 | * | 6/2021 | ......... G01R 31/3648 |
| JP | 2000-106219 A | | 4/2000 | |
| JP | 2009252381 A | | 10/2009 | |
| JP | 2010249797 A | | 11/2010 | |
| JP | 2010-275984 A | | 12/2010 | |
| JP | WO2011036760 A | | 3/2011 | |
| JP | 2012-181976 A | | 9/2012 | |
| JP | 2013125713 A | | 6/2013 | |
| JP | 2013185499 A | * | 9/2013 | ............. B01D 53/86 |
| JP | 2013196805 A | | 9/2013 | |
| JP | 2013-247003 A | | 12/2013 | |
| JP | 2014007025 A | | 1/2014 | |
| JP | WO2015064004 A1 | | 5/2015 | |
| JP | 5946436 B2 | * | 7/2016 | ............. G01R 31/36 |
| JP | WO2014/027389 A1 | | 7/2016 | |
| JP | 6084225 B2 | | 2/2017 | |
| KR | 10-20120099583 A | | 9/2012 | |
| KR | 10-20130142884 A | | 12/2013 | |
| KR | 20140052839 A | * | 5/2014 | ......... G01R 31/3835 |

OTHER PUBLICATIONS

International Search Report (with partial translation) and Written Opinion issued in corresponding International Patent Application No. PCT/KR2020/005188, dated Jul. 23, 2020.
Office Action issued from the Japanese Patent Office dated Feb. 22, 2022 in corresponding Japanese Patent Application No. 2021-505970.
Office Action dated Jun. 7, 2023 by the Chinese Patent Office for corresponding Chinese Patent Application No. 202080004727.0.

* cited by examiner

BATTERY MANAGEMENT APPARATUS AND METHOD USING NON-DESTRUCTIVE RESISTANCE ANALYSIS

TECHNICAL FIELD

The present application claims priority to Korean Patent Application No. 10-2019-0046308 filed on Apr. 19, 2019 in the Republic of Korea, the disclosures of which are incorporated herein by reference.

The present disclosure relates to a battery management apparatus and method, and more particularly, to a battery management apparatus and method using non-destructive resistance analysis for analyzing the change of resistance of a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at present include nickel-cadmium batteries, nickel hydrogen batteries, nickel-zinc batteries, lithium secondary batteries and the like. Among them, the lithium secondary batteries are in the limelight since they have almost no memory effect compared to nickel-based secondary batteries and also have very low self-charging rate and high energy density.

However, the lithium secondary battery may cause a lithium plate phenomenon where lithium metal is deposited on a negative electrode by charging and discharging, and in the worst case, the lithium plate phenomenon may cause a swelling phenomenon where the secondary battery is inflated, or cause the secondary battery to burst or ignite.

Therefore, in order to predict and prevent such a risk, Patent Document 1 that is the conventional art discloses a device and method for detecting and inspecting an abnormal SOC of a lithium secondary battery, which determines an abnormal SOC of the secondary battery according to a Q-dV/dQ curve based on electricity amount Q and voltage V.

However, Patent Document 1 only discloses a configuration for determining an abnormal SOC only after the abnormal SOC has occurred in the secondary battery, and does not disclose a configuration capable of solving the cause of the abnormal SOC of the secondary battery by changing control conditions of the secondary battery according to the Q-dV/dQ curve analysis.

(Patent Document 1) KR 10-2012-0099583 A

DISCLOSURE

Technical Problem

The present disclosure is designed to solve the problems of the related art, and therefore the present disclosure is directed to providing a battery management apparatus and method using a non-destructive resistance analysis, which may calculate a resistance change rate of a present state compared to an initial state (Beginning of Life, BoL) of a secondary battery according to a peak value extracted based on a Q-V curve and a Q-dV/dQ curve of the secondary battery, and change the charging and discharging control conditions of the secondary battery by adjusting at least one of a charge current and a discharge current of the secondary battery according to the calculated resistance change rate.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure to achieve the purpose are as follows.

In one aspect of the present disclosure, there is provided a battery management apparatus, comprising: a voltage measuring unit configured to measure a voltage of a battery cell; a current measuring unit configured to measure a current of the battery cell; and a control unit connected to the voltage measuring unit and the current measuring unit and configured to receive a voltage value for the voltage measured by the voltage measuring unit, receive a current value for the current measured by the current measuring unit, estimate an electricity amount of the battery cell based on the received current value, obtain an electricity amount-voltage curve for the battery cell based on the estimated electricity amount and the received voltage value, extract a plurality of inflection points from the obtained electricity amount-voltage curve, extract an electricity amount of a specific point satisfying a predetermined condition among the plurality of extracted inflection points, calculate a first function value for the extracted electricity amount of the specific point from a derivative of the electricity amount-voltage curve, extract a second function value corresponding to the first function value from a pre-stored reference electricity amount-voltage table, and calculate a resistance change rate of a present resistance with respect to an initial resistance of the battery cell based on the first function value and the second function value.

The control unit may be configured to adjust a magnitude of at least one of a charge current and a discharge current set to the battery cell according to the resistance change rate.

The control unit may be configured to reduce at least one of the charge current and the discharge current set to the battery cell, only when the first function value is smaller than the second function value.

The control unit may be configured to calculate an increase rate of the first function value with respect to the second function value and calculate a present resistance change rate with respect to the initial resistance pre-stored for the battery cell based on the calculated increase rate.

The control unit may be configured to classify a plurality of inflection points included in the electricity amount-voltage curve to a first inflection point group in which a derivative curve of the electricity amount-voltage curve shows an upwardly convex rough form and extract an inflection point located in a specific order based on the magnitude of the electricity amount among the plurality of inflection points belonging to the first inflection point group as the specific point.

The control unit may be configured to select location information of an extraction target inflection point corresponding to a type of a negative electrode active material included in the battery cell as the specific order in a look-up table where a negative electrode active material and location information of an extraction target inflection point corresponding to the negative electrode active material are mapped and stored in advance, and extract an inflection point located in the selected specific order based on the magnitude of the electricity amount among the plurality of inflection points belonging to the first inflection point group as the specific point.

When the battery cell includes a plurality of negative electrode active materials and a plurality of extraction target inflection points respectively corresponding to the types of the plurality of negative electrode active materials have different location information from each other in the pre-stored look-up table, the control unit may be configured to select a plurality of specific orders respectively corresponding to the plurality of negative electrode active materials and extract each of a plurality of inflection points located in the plurality of selected specific orders based on the magnitude of the electricity amount among the plurality of inflection points belonging to the first inflection point group as the specific point.

The battery cell may be configured so that the negative electrode active material includes a graphite component.

The control unit may be configured to extract a sixth inflection point based on the magnitude of the electricity amount among the plurality of inflection points belonging to the first inflection point group as the specific point.

A battery management method according to another aspect of the present disclosure may comprise: a voltage and current measuring step of measuring voltage and current of a battery cell; an electricity amount estimating step of estimating an electricity amount of the battery cell based on the measured current; an electricity amount-voltage curve obtaining step of obtaining an electricity amount-voltage curve for the battery cell based on the estimated electricity amount and the measured voltage value; an inflection point extracting step of extracting a plurality of inflection points from the obtained electricity amount-voltage curve; an electricity amount extracting step of extracting an electricity amount of a specific point satisfying a predetermined condition among the plurality of extracted inflection points; a first function value calculating step of calculating a first function value for the extracted electricity amount of the specific point from a derivative of the electricity amount-voltage curve; a second function value extracting step of extracting a second function value corresponding to the first function value in a pre-stored reference electricity amount-voltage table; and a resistance change rate calculating step of calculating a resistance change rate of a present resistance with respect to an initial resistance of the battery cell based on the first function value and the second function value.

The battery management method according to another aspect of the present disclosure may further comprise, after the resistance change rate calculating step, a charge and discharge current adjusting step of adjusting a magnitude of at least one of a charge current and a discharge current set to the battery cell according to the calculated resistance change rate.

A battery pack according to another aspect of the present disclosure may comprise the battery management apparatus an embodiment of the present disclosure.

An electric vehicle according to still another aspect of the present disclosure may comprise the battery management apparatus an embodiment of the present disclosure.

Advantageous Effects

According to an embodiment of the present disclosure, even if the EIS (Electrochemical Impedance Spectroscopy) analysis is not used, the resistance change rate of the battery cell may be calculated non-destructively using the QV curve and the Q-dV/dQ curve of the battery cell.

In addition, according to an embodiment of the present disclosure, since the resistance change rate of the battery cell may be calculated within a short period of time by analyzing the QV curve and the Q-dV/dQ curve, at least one of the charge current and the discharge current optimized for the present state of the battery cell may be set quickly.

In addition, according to an embodiment of the present disclosure, since the resistance change rate of the battery cell is calculated in consideration of the type and number of negative electrode active materials included in the battery cell, the reliability of calculating the resistance change rate of the battery cell may be increased.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
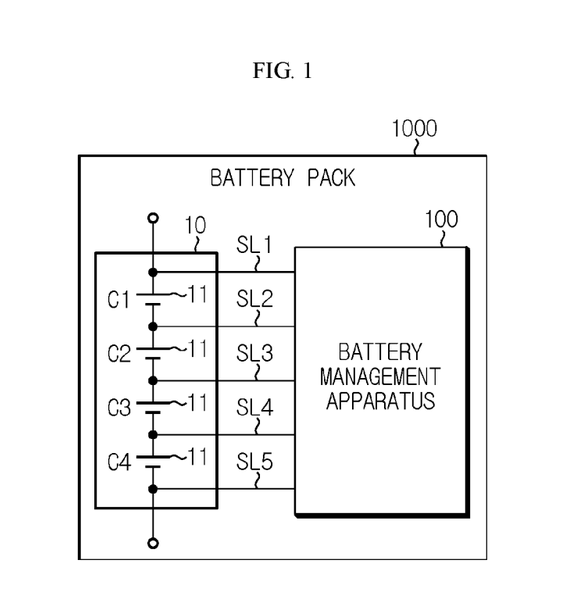
FIG. 1 is a diagram schematically showing a battery pack including a battery management apparatus according to an embodiment of the present disclosure.

FIG. 1 is a diagram schematically showing a battery pack 1000 including a battery management apparatus 100 according to an embodiment of the present disclosure.

Referring to FIG. 1, a battery management apparatus 100 according to an embodiment of the present disclosure may be electrically connected to a battery module 10 including a plurality of battery cells 11 to manage the plurality of battery cells 11.

The battery management apparatus 100 may measure voltage and current of each battery cell 11 and estimate a state of charge (SOC). Here, SOC may mean an electricity amount (Q) of each of the battery cells 11, and hereinafter, the SOC will be referred to as electricity amount.

The battery management apparatus 100 may calculate a resistance change rate of the battery cell 11 based on an electricity amount-voltage curve of the battery cell 11, and adjust at least one of a charge current and a discharge current of each battery cell 11 based on the calculated resistance change rate. Therefore, the battery management apparatus 100 may prevent problems such as overcharging or overdischarging of the battery cell 11 in advance by setting the charge current and the discharge current optimized for each battery cell 11.

In addition, the battery management apparatus 100 may be included in a battery pack 1000 together with the battery module 10. FIG. 1 shows an example in which one battery module 10 and one battery management apparatus 100 are included in the battery pack 1000, but the number of the battery module 10 and the battery management apparatus 100 included in the battery pack 1000 is not limited to the number shown in FIG. 1. Similarly, the number of battery cells 11 included in the battery module 10 is not limited to the number shown in FIG. 1.

Figure 2:
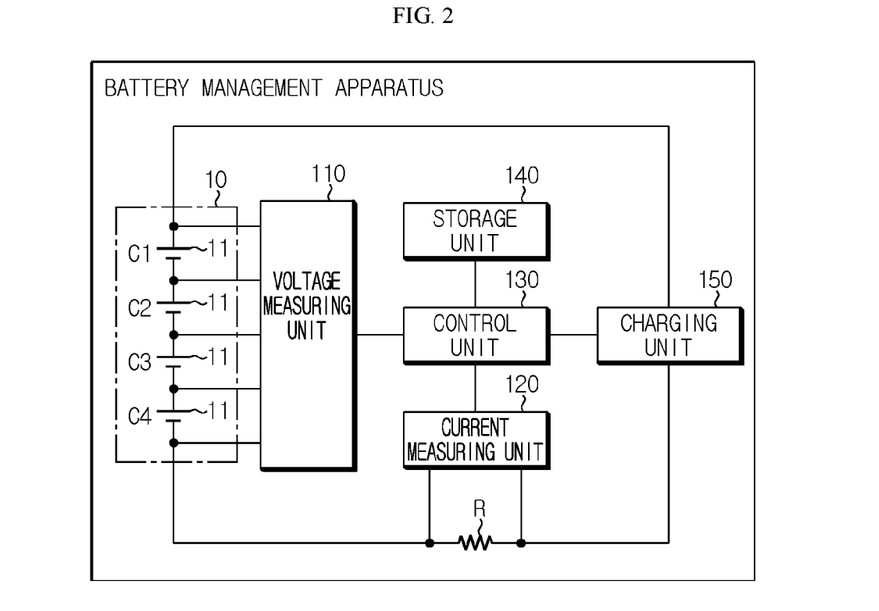
FIG. 2 is a block diagram schematically showing the battery management apparatus according to an embodiment of the present disclosure.

A detailed configuration of the battery management apparatus 100 will be described with reference to FIG. 2. FIG. 2 is a block diagram schematically showing the battery management apparatus 100 according to an embodiment of the present disclosure.

Referring to FIG. 2, the battery management apparatus 100 according to an embodiment of the present disclosure may include a voltage measuring unit 110, a current measuring unit 120 and a control unit 130.

The voltage measuring unit 110 may be configured to measure a voltage of the battery cell 11. That is, the voltage measuring unit 110 may measure the voltage of the battery cell 11 included in the battery pack 1000. Here, the battery pack 1000 may include a plurality of battery cells 11 connected to each other. The voltage measuring unit 110 may measure the voltage of each of the plurality of battery cells 11 connected to each other. More specifically, the plurality of battery cells 11 may be included in the battery module 10 and connected to each other. The voltage measuring unit 110 may be electrically connected to each battery cell 11 through a sensing line and measure the voltage of each battery cell 11.

For example, as shown in FIG. 1, the battery management apparatus 100 may be electrically connected to battery cells C1, C2, C3 and C4 included in battery module 10 through sensing lines SL1, SL2, SL3, SL4 and SL5. That is, the voltage measuring unit 110 may measure the voltage of each of the battery cells 11 included in the battery module 10 through the sensing lines SL1, SL2, SL3, SL4 and SL5. Specifically, the voltage measuring unit 110 may measure the voltage of the first battery cell C1 through the first sensing line SL1 and the second sensing line SL2 and measure the voltage of the second battery cell C2 through the second sensing line SL2 and the third sensing line SL3. In addition, the voltage measuring unit 110 may measure the voltage of the third battery cell C3 through the third sensing line SL3 and the fourth sensing line SL4 and measure the voltage of the fourth battery cell C4 through the fourth sensing line SL4 and the fifth sensing line SL5.

The current measuring unit 120 may be configured to charge the current of the battery cell 11. That is, the current measuring unit 120 may be configured to measure the charge current input to the battery cell 11 or the discharge current output from the battery cell 11. For example, in the embodiment of FIG. 2, the current measuring unit 120 may be connected to both ends of a sense resistor R to measure a charge current or a discharge current.

The control unit 130 may be configured to be connected to the voltage measuring unit 110 and the current measuring unit 120. That is, the control unit 130 may be connected to the voltage measuring unit 110 and the current measuring unit 120 in a circuit to control the operation of the voltage measuring unit 110 and the current measuring unit 120. For example, as in the embodiment of FIG. 2, the control unit 130 and the voltage measuring unit 110 may be connected through a line, and the control unit 130 and the current measuring unit 120 may be connected through another line. Here, the line to which the control unit 130 and the voltage measuring unit 110 are connected and the control unit 130 and the current measuring unit 120 are connected may be an example of a conducting wire capable of transmitting and receiving electrical signals.

The control unit 130 may be configured to receive a voltage value for the voltage measured by the voltage measuring unit 110. For example, the voltage measuring unit 110 may measure the voltage of the battery cell 11 and transmit the voltage value for the measured voltage to the control unit 130 through the line connected to the control unit 130. The control unit 130 may receive the voltage value for the voltage of the battery cell 11 measured by the voltage measuring unit 110 through the line connected to the voltage measuring unit 110.

The control unit 130 may be configured to receive a current value for the current measured by the current measuring unit 120. Similar to the above configuration in which the control unit 130 receives the voltage value from the voltage measuring unit 110, the control unit 130 may receive the current value for the current of the battery cell 11 measured by the current measuring unit 120. For example, the current measuring unit 120 may measure the current of the battery cell 11 and transmit the current value for the measured current to the control unit 130 through the line connected to the control unit 130. The control unit 130 may receive the current value for the current of the battery cell 11 measured by the current measuring unit 120 through the line connected to the current measuring unit 120.

The control unit 130 may be configured to estimate an electricity amount of the battery cell 11 based on the received current value. Here, the electricity amount is a state of charge (SOC) of the battery cell 11, and the control unit 130 may estimate the electricity amount of the battery cell 11 based on the current value received from the current measuring unit 120.

For example, it is assumed that the battery cell 11 is charged for 30 minutes with a charge current of 1C in a full discharge state. The control unit 130 may estimate that the electricity amount of the battery cell 11 is 50% based on the current value for the charge current applied to the battery cell 11 and the time during which the battery cell 11 is charged. That is, the control unit 130 may estimate the electricity amount of the battery cell 11 using a known current integration method.

The control unit 130 may be configured to obtain an electricity amount-voltage curve for the battery cell 11 based on the estimated electricity amount and the received voltage value. The obtained electricity amount-voltage curve will be described in detail with reference to FIG. 3.

Figure 3:
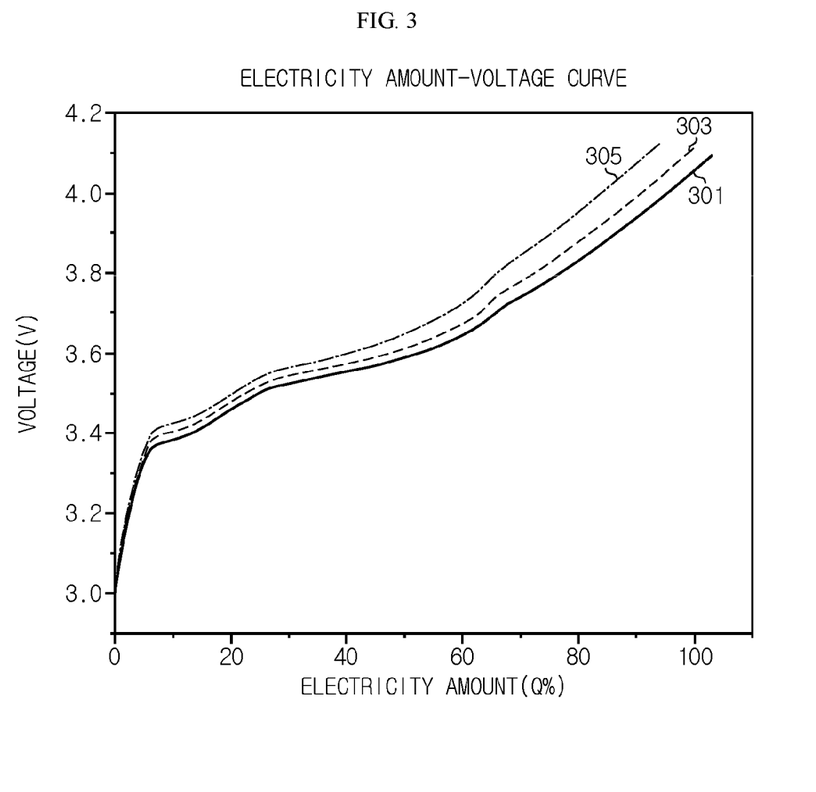
FIG. 3 is a diagram showing an example of an electricity amount-voltage curve obtained by the battery management apparatus according to an embodiment of the present disclosure.

FIG. 3 is a diagram showing an example of the electricity amount-voltage curve obtained by the battery management apparatus 100 according to an embodiment of the present disclosure. Referring to FIG. 3, the electricity amount-voltage curve may be expressed in a two-dimensional graph where the X-axis represents the electricity amount (Q, %) and the Y-axis represents the voltage (V). Specifically, FIG. 3 shows the electricity amount-voltage curves in a Beginning of Life (BoL) state 301, a 100 cycle state 303 in which 100 cycles of charge and discharge are performed, and a 500 cycle state 305 in which 500 cycles of charge and discharge are performed.

Here, the electricity amount-voltage curves of the BoL state 301, the 100 cycle state 303 and the 500 cycle state 305 are obtained based on the voltage and current measured under the following conditions. The battery cell 11 used a product containing graphite as a negative electrode active material, and the temperature was maintained at 45° C. In addition, the electricity amount-voltage curves were obtained based on the measured voltage and current when the battery cell 11 is charged with a charge current of 0.05 C from 3.0V to 4.2V in the full discharge state. In addition, the battery cell 11 of the 100 cycle state 303 is in a state where the battery cell 11 of the BoL state 301 is operated by 100 cycles with 1 CP. In addition, the battery cell 11 of the 500 cycle state 305 is in a state where which the battery cell 11 of the BoL state 301 is operated by 500 cycles with 1 CP, which is identical to a state where the battery cell 11 of the 100 cycle state 303 is operated further by 400 cycles with 1 CP.

Referring to the embodiment of FIG. 3, it may be seen that the electricity amount of the 500 cycle state 305 is higher than that of the BoL state 301 and the 100 cycle state 303 in the most electricity amount range.

For example, the voltage measuring unit 110 may measure the voltage of the battery cell 11 at a first time point and transmit the first voltage value for the measured voltage to the control unit 130. Likewise, the current measuring unit 120 may measure the current of the battery cell 11 at the first time point and transmit the first current value for the measured current to the control unit 130. The control unit 130 may receive the first voltage value and the first current value and estimate a first electricity amount of the battery cell 11 based on the first current value. The control unit 130 may map the received first voltage value and the estimated first electricity amount to each other. After that, the control unit 130 may map a second voltage value measured at a second time point and a second electricity amount estimated based on a second current value measured at the second time point to each other. The control unit 130 may map the voltage value of the battery cell 11 measured at each time point and the estimated electricity amount of the battery cell 11 to each other until the battery cell 11 is fully charged. The control unit 130 may obtain an electricity amount-voltage curve for the battery cell 11 based on the voltage value and the electricity amount of the battery cell 11 mapped to each other.

The control unit 130 may be configured to extract a plurality of inflection points from the obtained electricity amount-voltage curve. Here, the inflection point (or, point of inflection) is a commonly used word in the differential and integral calculus, and may mean a point or peak on the curve indicating a spot where the direction of the curve changes. That is, the control unit 130 may extract a plurality of inflection points or a plurality of peaks located at positions where the direction of the curve is changed among points on the obtained electricity amount-voltage curve. Hereinafter, for convenience of description, a point at which the direction of the curve changes in the electricity amount-voltage curve will be described as an inflection point.

The electricity amount-voltage curve obtained by the control unit 130 is a function that can be differentiated twice in all sections. Therefore, since extracting an inflection point from a function capable of two differentiation is known, a method of extracting a plurality of inflection points from the electricity amount-voltage curve obtained by the control unit 130 will not be described in detail here.

Figure 4:
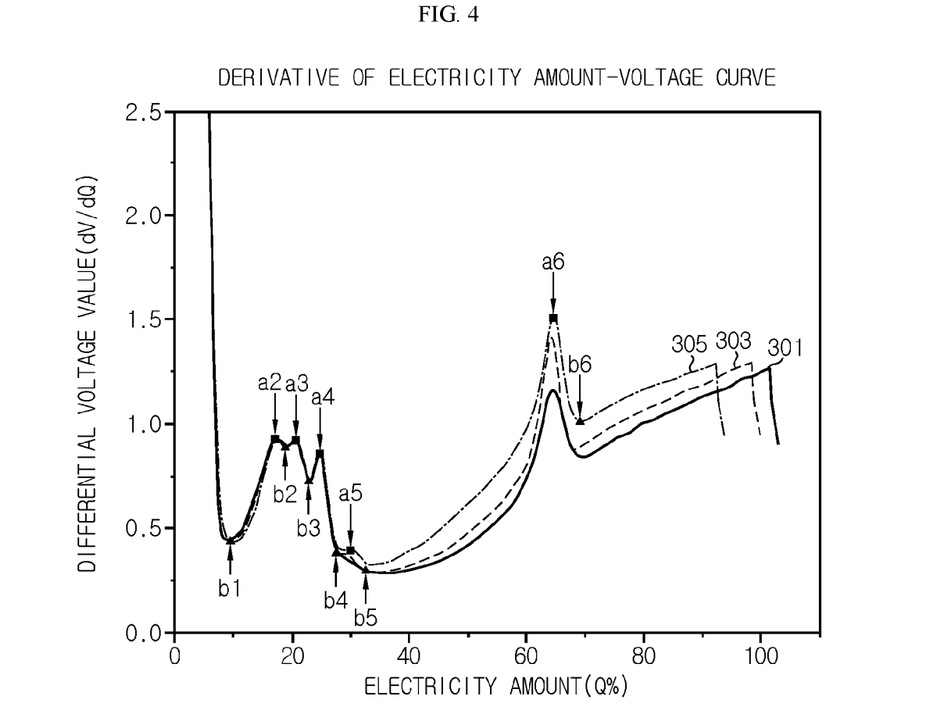
FIG. 4 is a diagram showing an example of a derivative curve of the electricity amount-voltage curve obtained by the battery management apparatus according to an embodiment of the present disclosure.

The plurality of inflection points extracted by the control unit 130 will be described with reference to FIG. 4. FIG. 4 is a diagram showing an example of a derivative curve of the electricity amount-voltage curve obtained by the battery management apparatus 100 according to an embodiment of the present disclosure. The derivative curve of the electricity amount-voltage curve may be expressed in a secondary graph where the X-axis represents the electricity amount (Q) and the Y-axis represents a differential voltage value (dV/dQ). Hereinafter, for convenience of explanation, the derivative of the electricity amount-voltage curve will be referred to as a derivative, and the curve of the derivative of the electricity amount-voltage curve will be referred to as a derivative curve.

For example, referring to the embodiment of FIG. 4, the control unit 130 may extract a plurality of inflection points from the derivative curve for each of the BoL state 301, the 100 cycle state 303 and the 500 cycle state 305. However, in the embodiment of FIG. 4, since inflection points may be visually confirmed in the derivative curves of the BoL state 301, the 100 cycle state 303 and the 500 cycle state 305, a plurality of inflection points are shown only in the derivative curve of the 500 cycle state 305. The plurality of inflection points extracted from the derivative curve of the 500 cycle state 305 by the control unit 130 may include inflection points a2 to a6 and b1 to b6. However, even though the inflection point a1 generally exists in a region where the electricity amount is 0% to 10%, the inflection point a1 is not shown in the graph for visibility and convenience of description because its differential voltage value, which is a Y-axis value, is located at a position seriously deviated from other inflection points.

The control unit 130 may be configured to extract an electricity amount at a specific point that satisfies a predetermined condition among the plurality of extracted inflection points. That is, the control unit 130 may select the specific point that satisfies a preset condition among the plurality of extracted inflection points and extract the electricity amount of the selected specific point. Here, the electricity amount of the specific point extracted by the control unit 130 may be an X-axis value of the specific point in the electricity amount-voltage curve.

Table 1 below shows electricity amounts (X-axis values) and differential voltage values (Y-axis values) of some inflection points selected from the derivative curve for each of the BoL state 301, the 100 cycle state 303 and the 500 cycle state 305, in the embodiment of FIG. 4. Specifically, Table 1 shows electricity amounts and differential voltage values of the inflection points corresponding to a2, a4 and a6 in the derivative curves of the BoL state 301 and the 100 cycle state 303 and the inflection points a2, a4 and a6 located in the derivative curve of the 500 cycle state 305.

TABLE 1

| state | a2 electricity amount | a2 differential voltage value | a4 electricity amount | a4 differential voltage value | a6 electricity amount | a6 differential voltage value |
|---|---|---|---|---|---|---|
| BoL state 301 | 0.17 | 0.92 | 0.25 | 0.87 | 0.64 | 1.16 |
| 100 cycle state 303 | 0.17 | 0.92 | 0.2 | 0.86 | 0.64 | 1.31 |
| 500 cycle state 305 | 0.17 | 0.92 | 0.25 | 0.84 | 0.64 | 1.42 |

Table 1 is an example of a table storing electricity amounts and differential voltage values. In Table 1, only electricity amounts and differential voltage values for the inflection points a2, a4 and a6 are shown, but electricity amounts and differential voltage values for the inflection points a1, a3, a5 and b1 to b6 may also be stored, without being limited thereto.

For example, it is assumed that the battery cell 11 corresponds to the 500 cycle state 305 at the present. Referring to Table 1, if the inflection point a6 is selected as a specific point satisfying the predetermined condition among the plurality of inflection points included in the derivative curve of the 500 cycle state 305, the control unit 130 may extract a value of the X-axis at the point where the inflection point 6a is located in the derivative curve of the 500 cycle state 305 as the electricity amount of the inflection point a6. In this case, the control unit 130 may extract 0.64 as the electricity amount of the inflection point a6.

The control unit 130 may calculate a first function value for the electricity amount of the specific point extracted from the derivative of the electricity amount-voltage curve. That is, the control unit 130 may calculate the differential voltage value (Y-axis value) of the specific point in the derivative curve of the battery cell 11 at the present as the first function value.

For example, as in the former embodiment, it is assumed that battery cell 11 is in the 500 cycle state 305 and the inflection point a6 located on the derivative curve of the 500 cycle state 305 is selected as a specific point. Referring to FIG. 4 and Table 1, the control unit 130 may calculate the differential voltage value for the electricity amount of the inflection point a6 in the derivative curve of the 500 cycle state 305 as the first function value. For example, the control unit 130 may calculate 1.16, which is the differential voltage value of the inflection point a6 in the curve of the 500 cycle state 305, as the first function value.

The control unit 130 may be configured to extract a second function value corresponding to the first function value from a pre-stored reference electricity amount-voltage table. Here, in the embodiment of FIG. 3, the pre-stored reference electricity amount-voltage table may include a table storing electricity amounts and differential voltage values for the inflection points included in the electricity amount-voltage curve of the BoL state 301. For example, the reference electricity amount-voltage table may refer to a table including a row about the BoL state 301 in Table 1.

Here, the first function value is a function value of a specific point in the derivative curve of the battery cell 11 at the present. In addition, the second function value corresponding to the first function value may be a function value of an inflection point having the same electricity amount as the electricity amount of the specific point in the derivative curve of the BoL state. That is, the first function value may be a function value of a specific point satisfying the predetermined condition among the plurality of inflection points included in the derivative curve of the battery cell 11 at the present, and the second function value may be a function value of an inflection point having the same X-axis value as the specific point among the plurality of inflection points included in the derivative curve of the BoL state 301.

Specifically, the second function value may be a differential voltage value of an inflection point having the same specific point and electricity amount in the derivative curve of the BoL state 301. For example, assuming that the electricity amount of the specific point is A (%), the first function value may be a differential voltage value of the derivative curve of the battery cell 11 at the present at a point where the straight line X=A meets the derivative curve of the battery cell 11 at the present, and the second function value may be a differential voltage value of the derivative curve of the BoL state at a point where the derivative curve of the BoL state 301 meets the straight line X=A.

For example, in the embodiment of FIG. 4 and Table 1, it is assumed that battery cell 11 is in the 500 cycle state 305 and the specific point is selected as a6. The first function value may be 1.42, which is the differential voltage value of the inflection point a6 in the derivative curve of the 500 cycle state 305, and the second function value may be 1.16, which is the differential voltage value of the electricity amount 0.64 that is the same as a6 in the derivative curve of the BoL state 301.

The control unit 130 may be configured to calculate a resistance change rate of a present resistance with regard to an initial resistance of the battery cell 11 based on the first function value and the second function value. That is, the control unit 130 may calculate the resistance change rate of the battery cell 11 based on the change rate of the first function value and the second function value. Here, the resistance change rate may mean a change rate (%) about how much the present resistance of the battery cell 11 is increased or decreased compared to the initial resistance. For example, assuming that the initial resistance is K[Ω] and the present resistance is 1.5 K[Ω], the resistance change rate is generally calculated as "(1.5K−K)÷K×100", so that the resistance change rate may be 50%. That is, the control unit 130 may calculate the resistance change rate of the initial resistance of the battery cell 11 based on the function value change rate of the first function value and the second function value.

The resistance change rate of the battery cell 11 is generally obtained by calculating a film resistance (or, solid-electrolyte interphase resistance) and a charge transfer resistance through the EIS analysis for a half cell. That is, it is practically impossible to accurately calculate the resistance change rate of the battery cell 11 using a non-destructive analysis method for the battery cell 11. However, the battery management apparatus 100 according to an embodiment of the present disclosure may calculate the resistance change rate of the battery cell 11 in a non-destructive way very close to an actual resistance change rate, based on the change amount of the differential voltage value (Y-axis value) of the specific point among the inflection points of the electricity amount-voltage curve of the battery cell 11. That is, even though the EIS analysis is not performed, the battery management apparatus 100 has an advantage of easily and quickly calculating the resistance change rate of the battery cell 11, which is very close to the actual resistance change rate.

The control unit 130 may selectively include processors known in the art, application-specific integrated circuit (ASIC), other chipsets, logic circuits, registers, communication modems, data processing devices, and the like to execute various control logics disclosed below. Also, when the control logic is implemented in software, the control unit 130 may be implemented as a set of program modules. At this time, the program module may be stored in a memory and executed by a processor. The memory may be located inside or out of the processor and may be connected to the processor by various well-known means. In addition, the memory may be included in a storage unit 140 of the present disclosure. Also, the memory refers to a device in which information is stored regardless of the type of device, and does not refer to any specific memory device.

The control unit 130 may be a battery management system (BMS) that may be electrically coupled with a secondary battery, or a control element included in the battery management system. The battery management system may mean a system called BMS in the related art, but any system that performs at least one function described in the present application may be included in the category of the battery management system from a functional point of view.

In addition, referring to FIG. 2, the battery management apparatus 100 according to an embodiment of the present disclosure may further include a storage unit 140. The storage unit 140 may store data, program or the like necessary for operation and function of each component of the battery management apparatus 100 according to an embodiment of the present disclosure. Here, the storage unit 140 is not particularly limited in its kind as long as it is a known information storage means that can record, erase, update and read data. As an example, the information storage means may include RAM, flash memory, ROM, EEPROM, registers, and the like.

For example, the storage unit 140 may store data about the differential voltage values and the electricity amounts mapped by the control unit 130. In addition, the reference electricity amount-voltage table for the derivative curve of the BoL state may be stored in the storage unit 140 in advance. In addition, the storage unit 140 may include a constant C for converting the function value change rate to the resistance change rate. In addition, the storage unit 140 may store program codes in which processes executable by the control unit 130 are defined.

The control unit 130 may be configured to adjust a magnitude of at least one of the charge current and discharge current set to the battery cell 11 according to the calculated resistance change rate. That is, the control unit 130 may control charging and discharging set to the battery cell 11 using the calculated resistance change rate.

For example, referring to FIG. 2, the battery management apparatus 100 according to an embodiment of the present disclosure may further include a charging unit 150. The charging unit 150 for supplying a current to the battery cell 11 may be included inside the battery management apparatus 100 or may be provided out of the battery management apparatus 100.

Both the charging unit 150 included inside the battery management apparatus 100 and the charging unit 150 provided out of the battery management apparatus 100 may be electrically connected to the control unit 130 and supply a current to the battery cell 11. In one embodiment, the charging unit 150 provided out of the battery management apparatus 100 may be connected to the control unit 130 using a connector. The connector includes a communication line, so that the charging unit 150 may communicate with the control unit 130.

The charging unit 150 may be configured to charge the battery cell 11 at a preset C-RATE. For example, if the charge current of the battery cell 11 is preset to 0.05 C-RATE, the charging unit 150 may charge the battery cell 11 at 0.05 C-RATE. Here, the preset C-RATE information may be stored in the storage unit 140.

The control unit 130 may control the charging unit 150 to charge the battery cell 11 at the adjusted C-RATE by calculating the resistance change rate and adjusting the preset C-RATE according to the calculated resistance change rate. For example, it is assumed that the calculated resistance change rate is 10% and the preset C-RATE is 0.05 C. The control unit 130 may reduce the preset C-RATE by 10%, and the charging unit 150 may charge the battery cell 11 at 0.045 C.

That is, the battery management apparatus 100 according to an embodiment of the present disclosure may not only calculate the resistance change rate of the battery cell 11 but also adjust at least one of the charge current and the discharge current of the battery cell 11 based on the calculated resistance change rate. Therefore, since the charge and/or discharge current optimized for the changed resistance state of the battery cell 11 is applied to the battery cell 11, it is possible to prevent problems such as overdischarge or overcharge caused by degeneration of the battery cell 11 in advance. In addition, the battery management apparatus 100 may prevent overcharge of the battery cell 11 by applying the charge and/or discharge current corresponding to the changed resistance of the battery cell 11, which may prevent a lithium plating phenomenon where lithium is deposited on the surface of the negative electrode active material.

Preferably, the control unit 130 may be configured to reduce at least one of the charge current and the discharge current set to the battery cell 11, only when the first function value is smaller than the second function value.

The control unit 130 may calculate the resistance change rate of the battery cell 11, and may not reduce at least one of the charge current and the discharge current set to the battery cell 11 if the calculated resistance change rate is negative. That is, the control unit 130 may reduce at least one of the charge current and the discharge current set to the battery cell 11 only when the resistance is increased due to the degradation of the battery cell 11.

The battery management apparatus 100 according to an embodiment of the present disclosure may not adjust the charge and/or discharge current set to the battery cell 11 only with the magnitude of the resistance change rate, and but may adjust the charge and/or discharge current set to the battery cell 11 based on the magnitude of the resistance change rate and also based on whether the resistance change rate increases or decreases. That is, the battery management apparatus 100 has an advantage of not adjusting the charge and/or discharge current unnecessarily, by adjusting the charge and/or discharge current set to the battery cell 11 only when the resistance of the battery cell 11 is reduced.

The control unit 130 may be configured to calculate an increase rate of the first function value with respect to the second function value and calculate a present resistance change rate with respect to the pre-stored initial resistance for the battery cell 11 based on the calculated increase rate.

For example, the control unit 130 may calculate a change rate (%) of the function value (differential voltage value) according to the formula "(first function value−second function value)÷second function value×100". In addition, the control unit 130 may calculate the resistance change rate of the battery cell 11 using Equation 1 below based on the calculated change rate of the function value.

$$\Delta R = \left\{ \left( \frac{I_{MoL} - I_{BoL}}{I_{BoL}} \right) \times 100 \right\} \times C \qquad \text{[Equation 1]}$$

In Equation 1, ΔR is the resistance change rate, $I_{MoL}$ is the first function value of the specific point calculated from the derivative curve of the battery cell 11 in a MoL (Middle of Life) state, IBoL is the second function value of the specific point calculated from the derivative curve in the BoL state, and C is a constant preset for each battery cell 11. For example, as in the previous example, the specific point may be a point corresponding to the position of a specific inflection point in the derivative curve. Preferably, the specific point may be the sixth inflection point in the derivative curve.

That is, the control unit 130 may calculate the resistance change rate of the battery cell 11 based on the change rate of the second function value with respect to the first function value. For example, in the embodiment of FIG. 4 and Table 1, it is assumed that the battery cell 11 is in the 500 cycle state 305 and the specific point is selected as a6. The control unit 130 may calculate 1.42 as the first function value and extract 1.16 as the second function value from the pre-stored reference electricity amount-voltage table. In addition, the control unit 130 may calculate "(1.42−1.16)÷1.16×100" to obtain the change rate of the function value as 22.41(%). Finally, the control unit 130 may calculate "22.41(%)×C" to obtain the resistance change rate.

In Equation 1, C is a constant for converting the change rate of the function value calculated by the control unit 130 into the resistance change rate for the battery cell 11, and may be a constant obtained experimentally. For example, C may be preset according to the product type of the battery cell 11.

Figure 5:
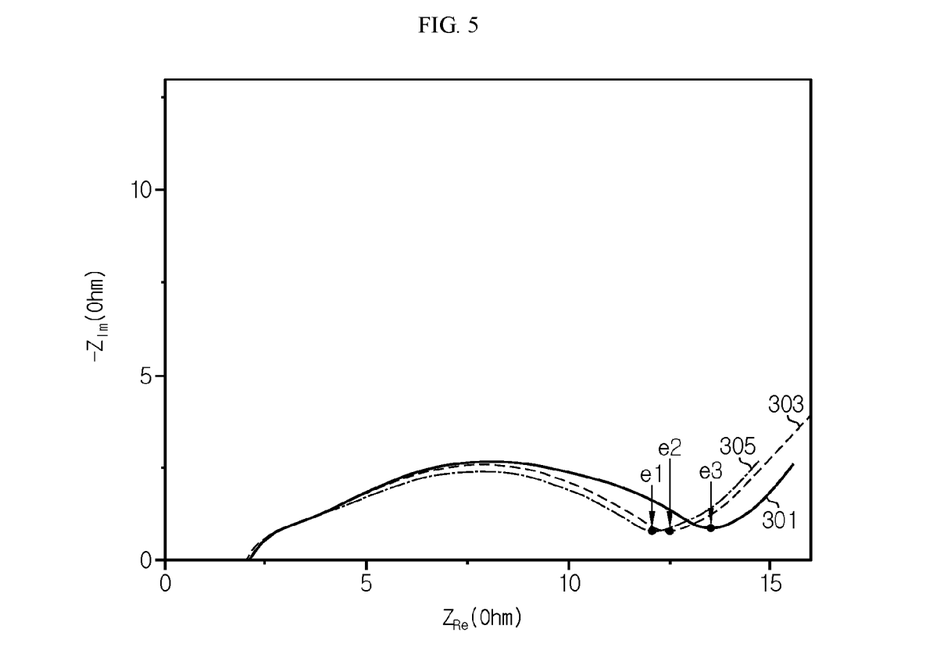
FIG. 5 is a diagram showing an EIS analysis result of a battery cell.

The method of calculating C will be described with reference to FIG. 5 and the table below. FIG. 5 is a diagram showing the EIS analysis result of the battery cell 11,

TABLE 2

| State | point | resistance (X-axis value) | resistance change rate (%) |
|---|---|---|---|
| BoL state 301 | e3 | 13.51 | 0 |
| 100 cycle state 303 | e2 | 12.386 | −8.32 |
| 500 cycle state 305 | e1 | 12.1 | −10.44 |

In Table 2, the resistance change rate of the 100 cycle state 303 may be calculated as "(e2−e3)÷e3×100", and the resistance change rate of the 500 cycle state 305 may be calculated as "(e1−e3)÷e3×100".

Referring to FIG. 5 and Table 2, it may be seen that both the resistance of the 100 cycle state 303 and the resistance of the 500 cycle state 305 are reduced lower than the resistance of the BoL state 301. That is, C is a constant for converting the change rate of the function value calculated by the control unit, which is for example 22.41(%), into −10.44(%) that is an actually measured resistance change rate, and C may be calculated as "10.44×−1÷22.41". At this time, C may be calculated as −0.4659.

Therefore, the control unit 130 may calculate the resistance change rate of the battery cell 11 by converting the change rate of the function value calculated using the experimentally obtained constant C into the resistance change rate.

That is, the battery management apparatus according to an embodiment of the present disclosure may calculate the resistance change rate of the battery cell based on the change rate between the first function value calculated based on a specific point satisfying the predetermined condition and the extracted second function value. Therefore, the resistance change rate of the battery cell may be calculated by a non-destructive way, and the time required to calculate the resistance change rate may be significantly shortened, compared to the time required to calculate the resistance change rate through EIS analysis.

The control unit 130 may be configured to classify the plurality of inflection points included in the electricity amount-voltage curve into a first inflection point group in which the derivative curve of the electricity amount-voltage curve has an upwardly convex rough form.

For example, in the embodiment of FIG. 4, 'a' means an inflection point where the derivative curve has an upwardly convex rough form, 'b' means an inflection point where the derivative curve has is a downwardly convex rough form, and 'number' means an order or location information of the inflection point. That is, the inflection point a1 means an inflection point having the smallest electricity amount among the inflection points where the derivative curve has an upwardly convex rough form, and the inflection point b1 means an inflection point having the smallest electricity amount among the inflection points where the derivative curve has a downwardly convex rough form. Therefore, the control unit 130 may classify the inflection points a1 to a6 where the derivative curve has an upwardly convex rough form into a first inflection point group and the inflection points b1 to b6 where the derivative curve has a downwardly convex rough form into a second inflection point group.

In addition, the control unit 130 may be configured to extract an inflection point located in a specific order as a specific point based on the magnitude of the electricity amount among the plurality of inflection points belonging to the first inflection point group. That is, the predetermined condition for extracting the specific point may be a condition to be located in the specific order based on the magnitude of the electricity amount. For example, the predetermined condition may be a condition for selecting an inflection point that is most sensitive to the increase or decrease of resistance among the plurality of inflection points included in the electricity amount-voltage curve of the battery cell 11.

For example, if the predetermined condition is set in advance as a condition to be located in the sixth order based on the magnitude of the electricity amount, the specific point satisfying the predetermined condition may be selected as a6, which has the sixth magnitude of the electricity amount among the inflection points belonging to the first inflection point group. As another example, if the predetermined condition is set in advance as a condition to be located in the second order based on the magnitude of the electricity amount, the specific point satisfying the predetermined condition may be selected from a2 having the second magnitude of the electricity amount among the inflection points belonging to the first inflection point group.

That is, the battery management apparatus 100 according to an embodiment of the present disclosure may calculate a function value change rate based on only one inflection point that is most sensitive to the increase or decrease of resistance among the plurality of inflection points included in the derivative curve of battery cell 11, and calculate a resistance change rate of the battery cell 11 based on the calculated function value change rate. Therefore, the battery management apparatus 100 has an advantage of minimizing errors that may occur when calculating the resistance change rate, by excluding inflection points insensitive to the change of resistance from the calculation of the resistance change rate. In addition, the battery management apparatus 100 may quickly calculate the resistance change rate of each battery cell 11 even in an industrial field such as an electric vehicle or an energy storage device including a plurality of battery cells 11.

The control unit 130 may be configured to select location information of an extraction target inflection point corresponding to the type of the negative electrode active material included in the battery cell 11 as the specific order in a look-up table where the negative electrode active material and the location information of the extraction target inflection point corresponding to the negative electrode active material are mapped and stored in advance.

Here, the pre-stored look-up table is a table in which the negative electrode active material and the location information of the extraction target inflection point corresponding to the negative electrode active material are mapped, and may be stored in advance in the storage unit 140. That is, the pre-stored look-up table may include location information of an inflection point that is most sensitive to the type of the negative electrode active material and the change of resistance of the battery cell 11 including the negative electrode active material. Here, the extraction target inflection point may be an inflection point that changes most sensitively to the resistance change of the battery cell 11.

In general, each negative electrode active material has a plurality of inflection points in the electricity amount-voltage curve, and among the plurality of inflection points, an inflection point most sensitive to the resistance change may be included. Therefore, the storage unit 140 may store the type of the negative electrode active material and the location information of the extraction target inflection point corresponding to the negative electrode active material.

In addition, the control unit 130 may be configured to extract an inflection point located in the selected specific order based on the magnitude of the electricity amount among the plurality of inflection points belonging to the first inflection point group as a specific point. The control unit 130 may select an inflection point based on which the resistance change rate is calculated, according to the type of the negative electrode active material of the battery cell 11.

That is, according to an embodiment of the present disclosure, a predetermined condition for selecting the specific point may be set differently according to the type of a battery, particularly the type of a negative electrode active material included in the battery. Therefore, the battery management apparatus 100 according to an embodiment of the present disclosure has an advantage of significantly lowering the possibility of erroneous calculation for the resistance change rate of the battery cell 11 by calculating the resistance change rate of the battery cell 11 in consideration of the type of the negative electrode active material of the battery cell 11.

Preferably, the control unit 130 includes a plurality of negative electrode active materials in the battery cell 11. If a plurality of extraction target inflection points respectively corresponding to types of the plurality of negative electrode active materials have different location information from each other in the pre-stored look-up table, the control unit 130 may select a plurality of specific orders respectively corresponding to the plurality of negative electrode active materials.

If a plurality of negative electrode active materials are included in the battery cell 11, an inflection point sensitive to the resistance change may be different for each negative electrode active material. Accordingly, the control unit 130 may select a plurality of specific orders corresponding to types and numbers of the plurality of negative electrode active materials in the pre-stored look-up table.

For example, if graphite and silicon are included in the negative electrode active material of the battery cell 11, the control unit 130 may select a first specific order corresponding to graphite and a second specific order corresponding to silicon in the look-up table.

In addition, the control unit 130 may be configured to extract each of the plurality of inflection points located in the plurality of specific orders based on the magnitude of the electricity amount among the plurality of inflection points belonging to the first inflection point group as the specific point.

For example, as in the former embodiment, if the negative electrode active material of the battery cell 11 includes graphite and silicon, the control unit 130 may extract the first inflection point located in the first specific order among the plurality of inflection points included in the electricity amount-voltage curve as the first specific point, and extract the second inflection point located in the second specific order as the second specific point. Here, if the first specific order and the second specific order are the same, the control unit 130 may extracted one specific point based on one specific order, as in the former embodiment where one specific order is selected.

The control unit 130 may calculate a resistance change rate based on a change rate of a plurality of function values calculated at the plurality of selected specific points. For example, the control unit 130 may calculate a resistance change rate based on an average change rate of the plurality of function values calculated at the plurality of specific points. In another example, since the erroneous calculation of the resistance change rate may directly affect the charging and/or discharge control of the battery cell 11, the control unit 130 may also calculate the resistance change rate based on a greatest function value among the plurality of function values calculated at the plurality of specific points.

The battery management apparatus 100 according to an embodiment of the present disclosure may extract a plurality of inflection points based on which a resistance change rate is calculated, according to the type and number of negative electrode active materials included in the battery cell 11. Therefore, the battery management apparatus 100 has an advantage of more accurately calculating the resistance change rate of the battery cell 11.

For example, the battery cell 11 may be configured such that the negative electrode active material includes a graphite component. In addition, the control unit 130 may be configured to extract the sixth inflection point as a specific point based on the magnitude of the electricity amount among the plurality of inflection points belonging to the first inflection point group.

FIG. 3 is a diagram showing an electricity amount-voltage curve of a battery cell 11 including graphite as the negative electrode active material, and FIG. 4 is a diagram showing a derivative curve of the battery cell 11 including graphite as the negative electrode active material. Also, Tables 1 and 2 show experimental data of the battery cell 11 containing graphite as the negative electrode active material.

Referring to FIG. 4, in the case of the battery cell 11 including only graphite as the negative electrode active material, it may be found that the inflection point located at the sixth order based on the magnitude of the electricity amount among the plurality of inflection points where the derivative curve has an upwardly convex rough form changes most sensitively to the resistance change.

Therefore, if the negative electrode active material is graphite, the location of the extraction target inflection point may be stored as the sixth location based on the electricity amount among the inflection points belonging to the first inflection point group. In addition, the control unit 130 may extract the inflection point located in the sixth order based on the electricity amount as the specific point.

The battery management apparatus 100 according to an embodiment of the present disclosure may rapidly and accurately calculate the resistance change rate of the battery cell 11 from the change rate of the function value of the specific inflection point, for the battery cell 11 including graphite as the negative electrode active material. Therefore, the possibility of erroneous calculation for the resistance change rate of the battery cell 11 including graphite as the negative electrode active material may be reduced. In addition, the charge/discharge control of the battery cell 11 may be optimized based on the present resistance state of the battery cell 11.

Figure 6:
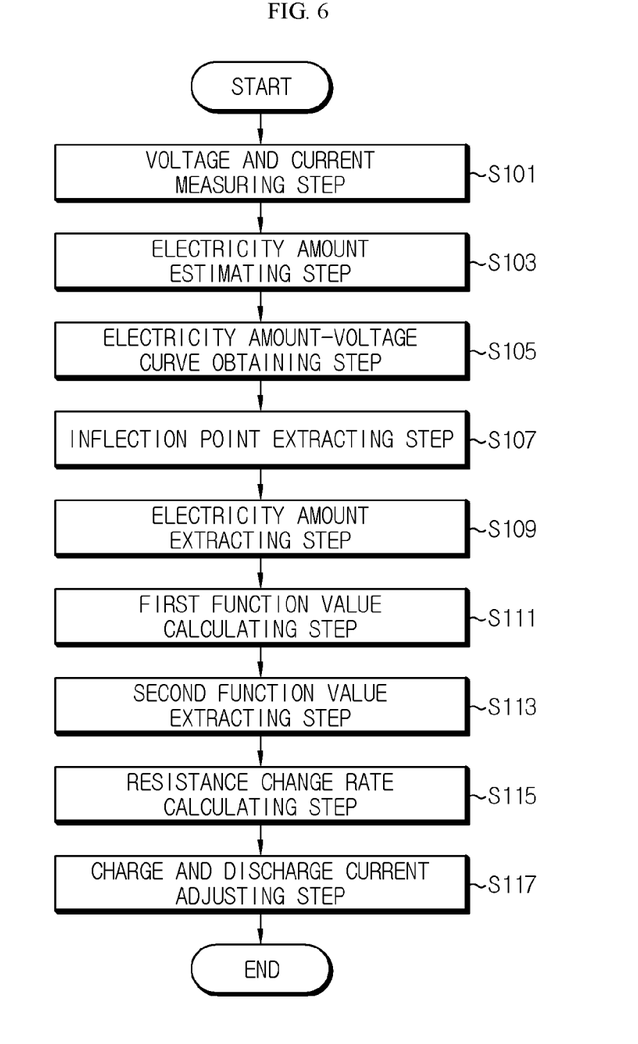
FIG. 6 is a flowchart schematically showing a battery management method according to an embodiment of the present disclosure.

Hereinafter, a battery management method according to an embodiment of the present disclosure will be described with reference to FIG. 6. FIG. 6 is a flowchart schematically showing the battery management method according to an embodiment of the present disclosure. Here, the battery management method may be operated in the battery management apparatus 100.

Referring to FIG. 6, the battery management method according to an embodiment of the present disclosure may include a voltage and current measuring step (S101), an electricity amount estimating step (S103), an electricity amount-voltage curve obtaining step (S105), an inflection point extracting step (S107), an electricity amount extracting step (S109), a first function value calculating step (S111), a second function value extracting step (S113), a resistance change rate calculating step (S115) and a charge and discharge current adjusting step (S117).

The voltage and current measuring step (S101) is a step of measuring voltage and current of the battery cell 11. In the voltage and current measuring step (S101), the voltage of the battery cell 11 may be measured by the voltage measuring unit 110, and the current of the battery cell 11 may be measured by the current measuring unit 120.

The voltage measuring unit 110 may transmit a voltage value for the measured voltage of the battery cell 11 to the control unit 130. The current measuring unit 120 may transmit a current value for the measured current of the battery cell 11 to the control unit 130.

The electricity amount estimating step (S103) is a step of estimating an electricity amount of the battery cell 11 based on the measured current. The electricity amount estimating step (S103) may be performed in the control unit 130.

The control unit 130 may estimate the electricity amount of the battery cell 11 based on the current value received from the current measuring unit 120. Here, the control unit 130 may estimate the electricity amount of the battery cell 11 using a known current integration method.

The electricity amount-voltage curve obtaining step (S105) is a step of obtaining an electricity amount-voltage curve for the battery cell 11 based on the estimated electricity amount and the measured voltage value. The electricity amount-voltage curve obtaining step (S105) may be performed in the control unit 130.

The control unit 130 may obtain the electricity amount-voltage curve by mapping the estimated electricity amount and the measured voltage value to each other. For example, the control unit 130 may express the electricity amount-voltage curve on a two-dimensional plane where the X-axis represents the amount of electricity (Q, %) and the Y-axis represents the voltage (V), based on the mapped electricity amount-voltage data. Referring to FIG. 3, the control unit 130 may obtain electricity amount-voltage curves of the BoL state 301, the 100 cycle state 303 and the 500 cycle state 305.

The inflection point extracting step (S107) is a step of extracting a plurality of inflection points from the obtained electricity amount-voltage curve. The inflection point extracting step (S107) may be performed in the control unit 130.

The control unit 130 may extract a plurality of inflection points located at positions where the direction of the curve is changed, among the points on the obtained electricity amount-voltage curve. The control unit 130 may extract the plurality of inflection points from the electricity amount-voltage curve according to a known mathematical method for extracting inflection points from a curve.

The electricity amount extracting step (S109) is a step of extracting an electricity amount of a specific point satisfying a predetermined condition among the plurality of extracted inflection points. The electricity amount extracting step (S109) may be performed in the control unit 130.

The control unit 130 may select a specific point satisfying a preset condition among the plurality of extracted inflection points, and extract the electricity amount of the selected specific point. That is, the control unit 130 may extract the electricity amount of the specific point by extracting an X-axis value of the specific point selected from the electricity amount-voltage curve. For example, when the selected specific point is expressed as (electricity amount, differential voltage value), it is assumed that the selected specific point is (0.64, 1.42(%)). In this case, the control unit 130 may extract 0.64 as the electricity amount of the specific point.

The first function value calculating step (S111) is a step of calculating a first function value for the electricity amount of the extracted specific point from a derivative of the electricity amount-voltage curve. The first function value calculating step (S111) may be performed in the control unit 130.

The control unit 130 may calculate a differential voltage value (Y-axis value) of the specific point in the derivative curve of the battery cell 11 at the present as the first function value. For example, as in the former embodiment, it is assumed that the selected specific point is (0.64, 1.42(%)). In this case, the control unit 130 may calculate 1.42(%) as the first function value.

The second function value extracting step (S113) is a step of extracting a second function value corresponding to the first function value from the pre-stored reference electricity amount-voltage table. The second function value extracting step (S113) may be performed in the control unit 130.

Here, the pre-stored reference electricity amount-voltage table is a table that stores the electricity amount and the differential voltage value of the BoL state 301 shown in FIGS. 3 and 4. The control unit 130 may extract a differential voltage value corresponding to the electricity amount of the specific point from the pre-stored reference electricity amount-voltage table. That is, the extracted differential voltage value and the second function value are the same.

For example, as in the former embodiment, it is assumed that the selected specific point is (0.64, 1.42(%)). In this case, the control unit 130 may extract 0.64 as the electricity amount of the specific point. In addition, the control unit 130 may extract the differential voltage value corresponding to the electricity amount 0.64 of the specific point from the pre-stored reference electricity amount-voltage table as the second function value. For example, if the differential voltage value corresponding to the electricity amount 0.64 in the pre-stored reference electricity amount-voltage table is 1.16 (%), the control unit 130 may extract 1.16(%) as the second function value.

The resistance change rate calculating step (S115) is a step of calculating a resistance change rate of the present resistance with respect to the initial resistance of the battery cell 11 based on the first function value and the second function value. The resistance change rate calculating step (S115) may be performed in the control unit 130.

First, the control unit 130 may calculate a change rate of the function value, which means the change rate of the first function value with respect to the second function value. For example, the control unit 130 may calculate the change rate (%) of the function value (differential voltage value) according to the equation "first function value−second function value)±second function value×100".

After that, the control unit 130 may calculate the resistance change rate of the battery cell 11 based on the calculated change rate of the function value.

The charge and discharge current adjusting step (S117) is a step of adjusting the magnitude of at least one of the charge current and the discharge current set to the battery cell 11 according to the calculated resistance change rate. The charge and discharge current adjusting step (S117) may be performed in the control unit 130.

After calculating the resistance change rate of the battery cell 11, the control unit 130 may adjust the magnitude of the charge and/or discharge current of the battery cell 11 to correspond to the calculated resistance change rate. In particular, the control unit 130 may reduce the magnitude of the charge and/or discharge current according to the calculated resistance change rate only when the resistance of the battery cell 11 is increased. In addition, the control unit 130 may control the charging unit 150 so that the adjusted charge and/or discharge current is applied to the battery cell 11. Therefore, the charging unit 150 may apply the charge and/or discharge current adjusted by the control unit 130 to the battery cell 11.

The battery pack 1000 according to the present disclosure may include the battery management apparatus 100 according to the present disclosure described above. In addition, the battery pack 1000 according to the present disclosure may further include a battery cell 11, various electrical components (including a BMS, a relay, a fuse, or the like) and a pack case, in addition to the battery management apparatus 100.

In addition, as another embodiment of the present disclosure, the battery management apparatus 100 may be mounted to various devices using electric energy, such as an electric vehicle, an energy storage system (ESS), and the like. In particular, the battery management apparatus 100 according to the present disclosure may be included in an electric vehicle. That is, the electric vehicle according to the present disclosure may include the battery management apparatus 100 according to the present disclosure. Here, the battery management apparatus 100 may be included in the battery pack 1000 or may be implemented as a device separate from the battery pack 1000. For example, at least a part of the battery management apparatus 100 may be implemented by an electronic control unit (ECU) of a vehicle. In addition, the vehicle according to the present disclosure may include a vehicle body or electronic equipment, which is typically provided in the vehicle, in addition to the battery management apparatus 100. For example, the vehicle according to the present disclosure may include a contactor, an inverter, a motor, at least one ECU, and the like, in addition to the battery management apparatus 100 according to the present disclosure. However, the present disclosure is not particularly limited in terms of components of the vehicle other than the battery management apparatus 100.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery module
11: battery cell
100: battery management apparatus
1000: battery pack
301: BoL state
303: 100 cycle state
305: 500 cycle state

What is claimed is:

1. A battery management apparatus, comprising:
   a voltage measurer configured to measure a voltage of a battery cell;
   a current measurer configured to measure a current of the battery cell; and
   a controller connected to the voltage measurer and the current measurer, the controller being configured to:
      receive a voltage value for the voltage measured by the voltage measurer;
      receive a current value for the current measured by the current measurer;
      estimate an electricity amount of the battery cell, based on the received current value;
      obtain an electricity amount-voltage curve for the battery cell, based on the estimated electricity amount and the received voltage value;
      extract a plurality of inflection points from the obtained electricity amount-voltage curve;
      classify inflection points at which a derivative curve of the electricity amount-voltage curve has an upwardly convex shape, among the plurality of inflection points in the electricity amount-voltage curve, as a first inflection point group;
      extract an electricity amount of a specific point satisfying a predetermined condition among the inflection points in the first inflection point group of the plurality of extracted inflection points;
      calculate a first function value for the extracted electricity amount of the specific point from a derivative of the electricity amount-voltage curve;
      extract a second function value corresponding to the first function value from a pre-stored reference electricity amount-voltage table; and
      calculate a resistance change rate of a present resistance with respect to an initial resistance of the battery cell, based on the first function value and the second function value.

2. The battery management apparatus according to claim 1, wherein the controller is further configured to adjust a magnitude of at least one of a charge current and a discharge current set to the battery cell according to the resistance change rate.

3. The battery management apparatus according to claim 2, wherein the controller is further configured to reduce at least one of the charge current and the discharge current set to the battery cell, only when the first function value is smaller than the second function value.

4. The battery management apparatus according to claim 1, wherein the controller is further configured to calculate an increase rate of the first function value with respect to the second function value and calculate a present resistance change rate with respect to the initial resistance pre-stored for the battery cell, based on the calculated increase rate.

5. The battery management apparatus according to claim 1, wherein the controller is further configured to:
   extract an inflection point located in a specific position in an order of the inflection points in the first inflection point group, ordered based on respective magnitudes of corresponding electricity amounts, as the specific point.

6. The battery management apparatus according to claim 5, wherein the controller is further configured to:
   select location information of an extraction target inflection point, corresponding to a type of a negative electrode active material included in the battery cell, as the specific position in the order in a look-up table where the negative electrode active material and the location information of the extraction target inflection point corresponding to the negative electrode active material are mapped and stored in advance; and
   extract an inflection point located in the selected specific position in the order of the inflection points in the first inflection point group, ordered based on the respective magnitudes of corresponding electricity amounts, as the specific point.

7. The battery management apparatus according to claim 6, wherein, when the battery cell includes a plurality of negative electrode active materials, and a plurality of extraction target inflection points, respectively corresponding to the types of the plurality of negative electrode active materials, have different location information from each other in the pre-stored look-up table, the controller is further configured to:
   select a plurality of specific positions in the order of the inflection points in the first inflection point group respectively corresponding to the plurality of negative electrode active materials; and
   extract each of a plurality of inflection points located in the plurality of selected specific positions in the order of the inflection points in the first inflection point group, ordered based on the respective magnitudes of the corresponding electricity amounts, as the specific point.

8. The battery management apparatus according to claim 6, wherein:
   the battery cell is configured such that the negative electrode active material includes a graphite component; and
   the controller is further configured to extract a sixth inflection point in the order of the inflection points in the first inflection point group, ordered based on the respective magnitudes of the corresponding electricity amounts, as the specific point.

9. A battery pack, comprising the battery management apparatus according to claim 1.

10. An electric vehicle, comprising the battery management apparatus according to claim 1.

11. A battery management method operated in a battery management apparatus, comprising:
   a voltage and current measuring operation of measuring voltage and current of a battery cell;

an electricity amount estimating operation of estimating an electricity amount of the battery cell, based on the measured current;

an electricity amount-voltage curve obtaining operation of obtaining an electricity amount-voltage curve for the battery cell, based on the estimated electricity amount and the measured voltage value;

an inflection point extracting operation of extracting a plurality of inflection points from the obtained electricity amount-voltage curve;

classifying, with a controller in the battery management apparatus, inflection points at which a derivative curve of the electricity amount-voltage curve has an upwardly convex shape, among the plurality of inflection points in the electricity amount-voltage curve, as a first inflection point group;

an electricity amount extracting operation of extracting an electricity amount of a specific point satisfying a predetermined condition among the inflection points in the first inflection point group of the plurality of extracted inflection points;

a first function value calculating operation of calculating a first function value for the extracted electricity amount of the specific point from a derivative of the electricity amount-voltage curve;

a second function value extracting operation of extracting a second function value corresponding to the first function value in a pre-stored reference electricity amount-voltage table; and a resistance change rate calculating operation of calculating a resistance change rate of a present resistance with respect to an initial resistance of the battery cell, based on the first function value and the second function value.

12. The battery management method according to claim 11, after the resistance change rate calculating operation, further comprising a charge and discharge current adjusting operation of adjusting a magnitude of at least one of a charge current and a discharge current set to the battery cell according to the calculated resistance change rate.

13. The battery management method of claim 11, wherein the electricity amount extracting operation includes:
extracting an inflection point located in a specific position in an order of the inflection points in the first inflection point group, ordered based on respective magnitudes of corresponding electricity amounts, as the specific point.

14. The battery management method of claim 13, wherein the electricity amount extracting operation includes:
selecting location information of an extraction target inflection point, corresponding to a type of a negative electrode active material included in the battery cell, as the specific position in the order in a look-up table where the negative electrode active material and the location information of the extraction target inflection point corresponding to the negative electrode active material are mapped and stored in advance; and
extracting an inflection point located in the selected specific position in the order of the inflection points in the first inflection point group, ordered based on the respective magnitudes of corresponding electricity amounts, as the specific point.

15. The battery management method of claim 14, wherein:
the battery cell includes a plurality of negative electrode active materials, and a plurality of extraction target inflection points, respectively corresponding to the types of the plurality of negative electrode active materials, have different location information from each other in the pre-stored look-up table; and
the electricity amount extracting operation includes:
selecting a plurality of specific positions in the order of the inflection points in the first inflection point group respectively corresponding to the plurality of negative electrode active materials; and
extracting each of a plurality of inflection points located in the plurality of selected specific positions in the order of the inflection points in the first inflection point group, ordered based on the respective magnitudes of the corresponding electricity amounts, as the specific point.

16. The battery management method of claim 14, wherein the electricity amount extracting operation includes extracting a sixth inflection point in the order of the inflection points in the first inflection point group, ordered based on the respective magnitudes of the corresponding electricity amounts, as the specific point.

* * * * *